United States Patent
Nanver et al.

(10) Patent No.: US 8,450,820 B2
(45) Date of Patent: May 28, 2013

(54) RADIATION DETECTOR

(76) Inventors: Lis Karen Nanver, Zoetermeer (NL); Thomas Ludovicus Maria Scholtes, Dordrecht (NL); Agata Šakić, Delft (NL); Cornelis Sander Kooijman, Veldhoven (NL); Gerard Nicolaas Anne van Veen, Waalre (NL)

(*) Notice: Subject to any disclaimer, the term of this patent is extended or adjusted under 35 U.S.C. 154(b) by 225 days.

(21) Appl. No.: 13/006,305

(22) Filed: Jan. 13, 2011

(65) Prior Publication Data

US 2011/0169116 A1    Jul. 14, 2011

(30) Foreign Application Priority Data

Jan. 13, 2010  (EP) .................................... 10150660

(51) Int. Cl.
*H01L 31/0224* (2006.01)

(52) U.S. Cl.
USPC ................. 257/429; 257/E31.124; 257/428; 438/56

(58) Field of Classification Search
USPC ................. 257/429, 428, E31.124; 438/56
See application file for complete search history.

(56) References Cited

U.S. PATENT DOCUMENTS

| | | | |
|---|---|---|---|
| 4,238,760 A | 12/1980 | Carr | |
| 5,320,878 A | 6/1994 | Maya | |
| 7,190,012 B2 | 3/2007 | Son et al. | |
| 7,417,249 B2 | 8/2008 | Akimoto et al. | |
| 7,476,598 B2 | 1/2009 | Son et al. | |
| 7,586,108 B2 | 9/2009 | Nihtianov et al. | |
| 7,718,979 B2 | 5/2010 | Knowles | |
| 2004/0021061 A1 | 2/2004 | Bijkerk | |

(Continued)

FOREIGN PATENT DOCUMENTS

| | | |
|---|---|---|
| JP | 5258701 | 10/1993 |
| JP | 11214739 | 6/1999 |
| JP | 2003282017 | 10/2003 |

OTHER PUBLICATIONS

F. Sarubbi et al., "Pure Boron-Doped Photodiodes: a Solution for Radiation Detection in EUV Lithography," ESSDERC 2008—38th European Solid-State device research conference Sep. 15-19, 2008, Sep. 19, 2008, pp. 278-281.

(Continued)

*Primary Examiner* — Long Pham
(74) *Attorney, Agent, or Firm* — Scheinberg & Associates; Michael O. Scheinberg; John B. Kelly

(57) ABSTRACT

The invention discloses a process for manufacturing a radiation detector for detecting e.g. 200 eV electrons. This makes the detector suited for e.g. use in an Scanning Electron Microscope. The detector is a PIN photodiode with a thin layer of pure boron connected to the $p^+$-diffusion layer. The boron layer is connected to an electrode with an aluminium grid to form a path of low electrical resistance between each given point of the boron layer and the electrode. The invention addresses forming the aluminium grid on the boron layer without damaging the boron layer. To that end the grid of aluminium is formed by covering the boron layer completely with a layer of aluminium and then removing part of the layer of aluminium by etching, the etching comprising a first step (304) of dry etching, the step of dry etching defining the grid but leaving a thin layer of aluminium on the part of the boron layer to be exposed, followed by a second step (308) of wet etching, the step of wet etching completely removing the aluminium from the part of the boron layer to be exposed.

19 Claims, 4 Drawing Sheets

U.S. PATENT DOCUMENTS

2008/0315121 A1  12/2008  Nihtianov et al.
2009/0021717 A1   1/2009  Nihtianov et al.
2010/0056549 A1   3/2010  Weissman et al.

OTHER PUBLICATIONS

M. Jutzi et al., "40-Gbit/s Ge-Si Photodiodes," Silicon Monolithic integrated circuits in RF systems, 2006, Digest of papers. 2006 Topical meeting in San Diego, CA, Jan. 18, 2005, pp. 303-307.

N. Sato et al., "Plasma CVD-Grown 10B-Enriched Boron Films for Si Neutron Detectors," Japanese journeal of applied physics, DOI:10.1143/JJAP.29.2526, vol. 29, No. 11, Part 01, Nov. 1, 1990 22, 1990, pp. 2526-2530.

Danilatos, G.D., "Introduction to the ESEM Instrument," Microscopy Research and Technique, Jan. 1, 1993, pp. 354-361, vol. 25.

Lecours A., et al., "Defining Micron-Scale Platinum Contacts on Hydrogenated Amorphous Silicon", "Journal of Vacuum Science and Technology B", Jan./Feb. 1990, pp. 109-110, vol. 8, No. 1.

RADIATION DETECTOR

The invention relates to a method of manufacturing a radiation detector having a radiation sensitive surface, the method comprising the steps of:

A step of providing a planar substrate, the substrate showing an n-doped plane and an intrinsic layer formed on the n-doped plane;

A step of depositing a layer comprising boron on the intrinsic layer, thereby forming a p$^+$-type diffusion layer and a top layer comprising boron;

A step of forming a grid of conductive material on the boron, at least part of the grid formed on the top layer, said grid electrically connected to the top layer while leaving part of the top layer exposed, the grid forming a first electrode; and A step of forming a second electrode connected with the n-doped plane.

Such a radiation detector is known from European Patent Application No. EP2009705.

In a particle-optical apparatus a beam of particles, such as energetic ions or electrons, irradiates a sample. As a result secondary radiation, including back-scattered electrons (BSE's), secondary electrons (SE's), photons, and in the case of ions impinging also secondary ions, emerge from the sample. This emerging radiation is used to obtain information about the sample.

As an example, in a Scanning Electron Microscope (SEM) electrons with an energy of, for example, between 200 eV and 30 keV are focused on the sample. It is noted that these energies are not absolute limits: SEM's with energies as low as 100 eV or lower are known, as well as SEM's with an energy as high as 50 keV.

The impinging beam is scanned over the sample, and generates for each scanned position SE's and BSE's. BSE's typically have an energy that is a large amount of the original energy, while SE's have an energy of less than 50 eV, and a majority of the SE's even have an energy of less than 5 eV when leaving the sample.

Detecting the SE's is often done with the well-known Everhart-Thornley detector (ET-detector). The ET-detector collects SE's with an electric field, causing the low energetic electrons to drift to the detector, where they are accelerated to, for example, 10 keV and impinge on a fluorescent screen. The light of this screen is then detected with a photomultiplier, resulting in a signal proportional to the amount of impinging electrons.

BSE's, having a much higher energy, are not effectively collected by the ET-detector, as they do not drift to the detector, and the detector is only seen under a small solid angle from the sample. Therefore for BSE's often a Solid State Detector is used, such as a four quadrant P-I-N diode, in which the electrons are detected in the intrinsic layer. Electrons with an energy of several keV impinge on the diode, generating a large number of electron-hole pairs in the photodiode, which are then detected. The diode, with a diameter of e.g. 20 mm, is typically mounted less than 5 mm above the sample and is seen under an opening angle of, for example, $\pi/2$ steradian.

A disadvantage of such a photodiode is that, when the energy of the BSE's is low due to, for example, a low energy of the primary beam, the BSE's do not penetrate through the surface of the diode, the so-named 'dead zone', into the active volume, the depletion layer, where holes and electrons are divided to be collected by electrodes, thus forming the signal. In other words: if the depletion layer is removed from the surface, many of the electron-hole pairs are not detected.

It is noted that, by biasing the detector with respect to the sample, the energy with which the electrons emerge from the sample may differ from the energy with which they hit the detector.

It is further noted that such detectors can also be used in a Transmission Electron Microscope (TEM), in which electrons with an energy of, for example, between 50 and 400 keV irradiate a sample. Backscattered electrons detected in a TEM typically have an energy which is a large fraction of the energy with which the sample is irradiated.

There is a demand for photodiodes with a thin dead zone, and an active volume (a depletion layer) just below the surface.

An example of a diode with a thin dead zone is described in European Patent Application No. EP2009705.

In one of the embodiments of this application a radiation detector in the form of a diode is disclosed, the diode formed on a silicon substrate. The n-doped substrate has a surface with an intrinsic layer, for example in the form of an epitaxial layer, formed on it, and a layer of pure boron on top of the intrinsic layer, as a result a layer of silicon-boride ($B_xSi_{1-x}$) is formed between the boron layer and the intrinsic layer, and a p$^+$-type diffusion layer in which boron is the dopant material between the silicon-boride layer and the intrinsic layer. A depletion layer is thus formed between the n-doped substrate and the p$^+$-diffusion layer. The diffusion layer may be as thin as 1-10 nm, and the boron layer between 1-20 nm.

It is noted that in this context the intrinsic layer is often n-doped, depending on the desired depletion layer width (capacitance). The n-doping value may be as low as much as $10^{12}$ cm$^{-3}$ but can be higher. A conductive grid is formed on the boron layer, thereby forming an electrode collecting holes. The substrate is connected to a second electrode, collecting the electrons. Because the boron layer and the silicon-boride layer are thin, e.g. 3-5 nm each, electrons with an energy of, for example, between 200 eV and 40 keV (or up to 400 keV in the case of a TEM) can enter the intrinsic layer to be detected.

It is further disclosed that a protective layer can be formed on top of the boron layer to protect the device from contamination. Such a protective layer is, for example, $SiO_2$, as this is transparent to electromagnetic radiation with a photon energy between 10-200 nm and as this is resistant to cleaning with, for example, a hydrogen plasma to remove carbon deposits.

It is noted that, although the known European Patent Application No. EP2009705 mentions that "process flows exist to provide a metallic grid without use of isolation layer, e.g. an oxide layer", it fails to disclose such a process. More specifically it fails to disclose a process flow in which to provide a grid on a boron layer with a thickness of only several nanometres, for example 5 nm or less, without damaging the boron layer.

In its disclosure it only shows embodiments in which a protective layer of, for example, $SiO_2$ is placed on the boron before forming the metallic grid. This is apparent from e.g. FIG. 3 of the known application, where an overlap is shown of the metallic grid over the protective layer. In other words: the part of the boron layer in contact with the aluminium grid is smaller than the projection of the aluminium grid on the boron layer.

This is in contrast to the process flow shown in FIG. 6 of the known European patent application, wherein the grid is formed before the (optional) step of covering the exposed boron layer with a protective layer. It is not further disclosed which process is used to cover the boron layer only partly.

Although a protective layer of $SiO_2$ is acceptable when detecting photons with a short wavelength, due to the high transparency of $SiO_2$ for such photons, the addition of a protective layer adds to the thickness of material to be traversed before an electron comes into the depletion area. Thereby the minimum energy of detected electrons rises. Also in particle-optical apparatus contamination plays a major role, and cleaning with, for example, a plasma is well known.

There is a need for a process for forming a detector that is compatible with detecting electrons of a low energy.

To that end the method for forming such a detector is characterized in that the grid of conductive material is formed by covering the top layer completely with a layer of conductive material and then removing part of the layer of conductive material by etching, the etching comprising a first step of dry etching, the step of dry etching defining the grid but leaving a thin layer of conductive material on the part of the boron layer to be exposed, followed by a second step of wet etching, the step of wet etching completely removing the conductive layer from the part of the boron layer to be exposed.

Inventors recognized that the well-known dry etching process, such as exposing a surface to a plasma, is an etching method with a well defined etching rate. However, without the use of an etch stop dry etching may cause damage to the boron layer. In a thin boron layer this may cause holes in the boron layer. This is due to the fact that boron is not well resistant to the dry etching recipes used to remove inorganic materials, and therefore a layer of only a few nanometres thickness will be damaged by the dry etching. The use of an etch stop is not attractive either, as this involves additional process steps and may result in a residue on the part of the boron layer to be exposed.

It is noted that a thin boron layer, for example a boron layer with a thickness of 3 to 10 nm, more preferably between 1 to 5 nm, is preferred as the depletion layer is then close to the surface, resulting in a detector capable of, for example, detecting low-energy electrons.

The invention is based on the insight that wet etching, such as dipping the substrate in diluted HF (for example 0.55% HF), is an etching method that results in a high selectivity: e.g. aluminium shows a much higher etching rate (in the range of 100 nm per minute) than boron (having an etch rate of less than 1 nm per minute).

The disadvantage of wet etching is that it is isotropic and can therefore not be used to accurately create line widths in the 1 micron range (0.1 µm-10 µm).

An alternative to wet etching is dry etching. However, dry etching shows little or no selectivity between e.g. aluminium and boron, and is thus not suited to etch an aluminium layer completely while leaving the boron layer intact.

Inventors formulated an etching method cleverly combining the required characteristics of dry etching and wet etching by using a dry etch step as a first step, ending said dry etching while a thin layer remains on the boron layer, followed by wet etching as a second etching step, wet etching showing sufficient selectivity to remove the remaining thin layer of conductive material without damaging the boron layer.

Inventors thus found that, by having first a dry etching step, the first step defining the conductive grid but leaving a thin layer on the parts of the boron layer to be exposed, followed by a wet etching step exposing said parts, the boron layer could be kept intact while removing all conductive material and leaving the grid dimensions very close to those defined by the dry etching It is noted that the intrinsic layer can be formed on an n-doped substrate, or on an n-doped layer of the substrate.

It is noted that where reference to a 'boron layer' is made, this should be construed widely, and this includes reference to layers comprising an excess of boron. Important is that the layer comprises an excess of boron and shows good conductance. Additions (either added on purpose or in the form of contaminants) may be, for example, carbon, oxygen or nitrogen, amounting to, for example, up to 30%.

It is mentioned that for higher amounts of additions the conductive boron layer may break up into conductive islands in a sea of isolating boron compounds, thus not leading to the desired conductive layer.

It is further mentioned that other materials, such as gallium, may be added as well.

It is noted that, even if the additions add up to 50%, such as 50% nitrogen and 50% boron, this does not imply that a layer of e.g. boronnitride is formed, as the crystallographic form of the 50/50% mixture may differ from a crystal.

In an embodiment of the method according to the invention the detector comprises a protective layer of boron nitride, boron carbide, boron oxide, or a mixture thereof, formed on at least the exposed part of the top layer, the protective layer having a thickness of less than five nanometres, more specifically less than three nanometres.

To prevent damage to the detector due to, for example, plasma cleaning, the exposed part of the top layer is preferably covered with a protective layer that is both thin and made of low-Z material, so that low energy particles can be detected. The protective layer should also be thin, so as to pass radiation such as electrons to the depleted region (the 'active' region). By using a protective layer comprising boron and a light element, a protective layer can be formed that is thin and shows a low scattering coefficient for e.g. electrons. Also the protective properties of boron compounds, such as their chemical resistance and its mechanical properties, are very good.

It is noted that the boron, or part of the boron, may originate from the top layer.

It is remarked that boron compounds are in general also good electrical isolators. This could pose a problem when detecting low energy particles, as these are, for example, repelled from the detector. However, due to the thickness of only several nanometres, the charge will tunnel through the protective layer to the boron layer.

It is remarked that in this process the protective layer may cover both the top layer and the conductive grid.

In another embodiment of the method according to the invention a through-hole is formed in the substrate before wet etching the exposed part of the top layer, the inside of the through-hole covered with a conductive layer before or after wet etching the exposed part of the top layer.

This embodiment is useful for manufacturing detectors for use in a particle-optical apparatus such as a SEM, where the detector is mounted between the sample and a particle-optical column producing a beam of particles, the through-hole passing the beam of particles.

It is noted that from a manufacturing point of view it is easiest to etch the through-hole from the back-side towards the radiation sensitive side.

It is mentioned that the through-hole need not have a constant diameter: in many applications it is preferred that the through-hole has its smallest diameter at the radiation sensitive side. It may be formed as a tapering hole, or as a cylinder with one or more steps in it.

By covering the inside of the through-hole with a conductive layer, this layer may be connected to a fixed potential to avoid charging of the inside of the through-hole. This fixed potential may be the same potential as the second electrode, or a slightly different potential. Connecting the inside with the second electrode may be done on the detector (e.g. by covering the back-side of the electrode and the inside of the through-hole with one continuous metallization), or by wiring the two together.

It is noted that the detector may be locally thinned by back-etching to minimize the length of the through-hole. A small length of the hole is preferred to avoid charging effects when a beam of particles passes through the hole. This back-etching may be a selective etching, resulting in an etching of (part of) the substrate up to, or close to, the intrinsic layer, resulting in the smallest remaining thickness of the wafer material.

The hole is preferably a round hole to avoid astigmatism or other optical effects on the beam passing through the hole associated with non-round holes (so-called multipole effects).

In yet another embodiment of the method according to the invention the conductive material of the grid comprises Al, Ti, TiN, Co, Mo, Pd, Pt, W, Au, Ni, Cr, Cu and/or C.

A pilot series of the detector, equipped with an aluminium grid, was produced, thus showing the compatibility of aluminium with the method, more specifically with the etching method.

Also the use of carbon as material for the conductive layer is foreseen, as this is a light material. As well-known, low-Z materials, such as carbon (and to a lesser extent aluminium), show little absorption of X-ray quanta compared to high-Z materials.

In yet another embodiment of the method according to the invention the intrinsic layer has a thickness in excess of 1 µm, more specifically more than 10 µm, most specifically more than 40 µm, as a result of which the capacitance of the detector showing a surface area of N mm$^2$ is less than 100×N pF, more specifically less than 10×N pF, most specifically less than 2.5×N pF, respectively.

The thickness of the intrinsic layer determines the capacitance between the first and the second electrode, as it is the plate distance of the plate capacitance, with the first and the second electrode as the plates. The capacitance can then be derived from the formula $C=\epsilon_r \cdot \epsilon_o \cdot A/d$, with $\epsilon_r$ the relative dielectric constant of the material between the plates ($\epsilon_r=12.85$ for silicon), $\epsilon_o$ the permeativity of vacuum (8,854 pF/m), A the surface area of the plates (in m$^2$) and d the distance (in m). For a thickness of the silicon intrinsic layer of 1 µm this corresponds to 100 pF/mm$^2$, for 10 µm with 10 pF/mm$^2$ and for 40 µm with 2.5 pF/mm$^2$. In semiconductor technology an intrinsic layer with a thickness in excess of 1 µm is hardly used. However, when detecting particles it is beneficial to have a small capacitance between the electrodes: the induced current is quite small: a 250 eV electron generates in silicon at most 69 electron/hole pairs (as 3.6 eV is needed to produce an electron/hole pair), resulting in a charge of approximately $69 \times 1.6 \times 10^{-19}$ C. Even when charging a small capacitor with this charge, only a very small voltage is generated: assume a capacitor of 10 pF, the voltage is only about 1 µV. The voltage induced by a current is proportional to the capacitance. Therefore a low capacitance is preferred so that a relatively large output voltage can be generated per detected particle, hence, giving a higher signal-to-noise ratio.

In yet another embodiment of the method according to the invention the intrinsic layer is an epitaxial layer.

Epitaxial growth on a wafer is a well-known method to form an intrinsic zone on a substrate.

It is noted that an intrinsic layer can also be formed on an n-doped substrate by purifying the substrate from one side, and sweeping the impurities (allowing them to diffuse to) a predefined area in/on the wafer. Such a predefined area is formed by a high-energy n$^-$-implant. Such substrates are produced by e.g. SiTek Electro Optics AB, Partille, Sweden.

In yet another embodiment of the method according to the invention the temperature of the substrate during and after forming the boron layer is kept below 750° C., more specifically below 700° C., most specifically below 600° C.

By keeping the temperature below 750° C., more specifically below 700° C., most specifically below 600° C., mobility of boron in the semiconductor material is negligible, and thus a thin p$^+$-type diffusion layer can be created. When the temperature rises above 700° C., the pure boron layer diffuses into the semiconductor, giving rise to a thicker p$^+$-type diffusion layer, resulting in a thicker dead zone and a depletion layer that is removed further from the surface, and thus a higher minimum energy of the particles that are detected.

In yet another embodiment of the method according to the invention a multitude of detectors is formed on the substrate, the detectors placed side-by-side or placed on top of each other.

By forming several detectors at the surface of one substrate, for example by forming four detectors arranged in four sectors round a through-hole, position sensitive detection can be achieved. Such position sensitive detection on the detector is the result of a directional effect on the sample. As known to the person skilled in the art this may be the result of topography, or of crystallographic effects. It is also known that the scattering angle of back-scattered electrons gives information about the elemental composition of the sample.

Preferably the detectors are placed adjacent to each other to cover as much of the surface as possible.

Detectors can also be formed at a different distance from the surface, thereby forming surface detectors and so-named buried detectors. The buried detector can be used for detecting radiation with a greater penetration depth, such as higher energy particles and/or X-ray quanta, while the uppermost detector (with a thin boron layer and thin p$^+$-type diffusion layer) is used for detecting radiation with low penetration depth.

It is noted that the uppermost detector will also detect the radiation with large penetration depth, but that the buried detector will generate a signal for radiation with a large penetration depth only.

Preferably such stacked detectors are made by direct bonding of two detectors, but forming a buried detector first and then forming the uppermost detector on it is also possible.

It is noted that buried detectors are known for photodiodes, the detectors at different depths showing a different response to different wavelengths.

In yet another embodiment of the invention the step of depositing a layer comprising boron is a step of depositing boron with an amount of more than 70% boron, more preferably more than 90%, most preferably more than 99%.

As mentioned earlier the top layer need not be a pure boron layer, and therefore also the material deposited on the intrinsic layer need not be pure. Especially amounts of nitrogen, carbon or oxygen, as often present during deposition, are allowed as far as the layer formed is conductive. Preferably the contaminants are low-Z contaminants so as to intercept as little electrons as possible.

In yet another aspect of the invention the layer of conductive material is a homogeneous layer of conductive material.

When depositing a layer of conductive material that itself comprises at least two layers of material, one closest to the top layer could act as a stop layer. However, the method shown here explicitly enables homogeneous materials to be processed into a grid without damaging the top layer, mainly comprising boron.

The invention is now elucidated by means of figures, in which corresponding reference numerals indicate corresponding parts.

BRIEF DESCRIPTION OF THE DRAWINGS

To that end.

Figure 1:
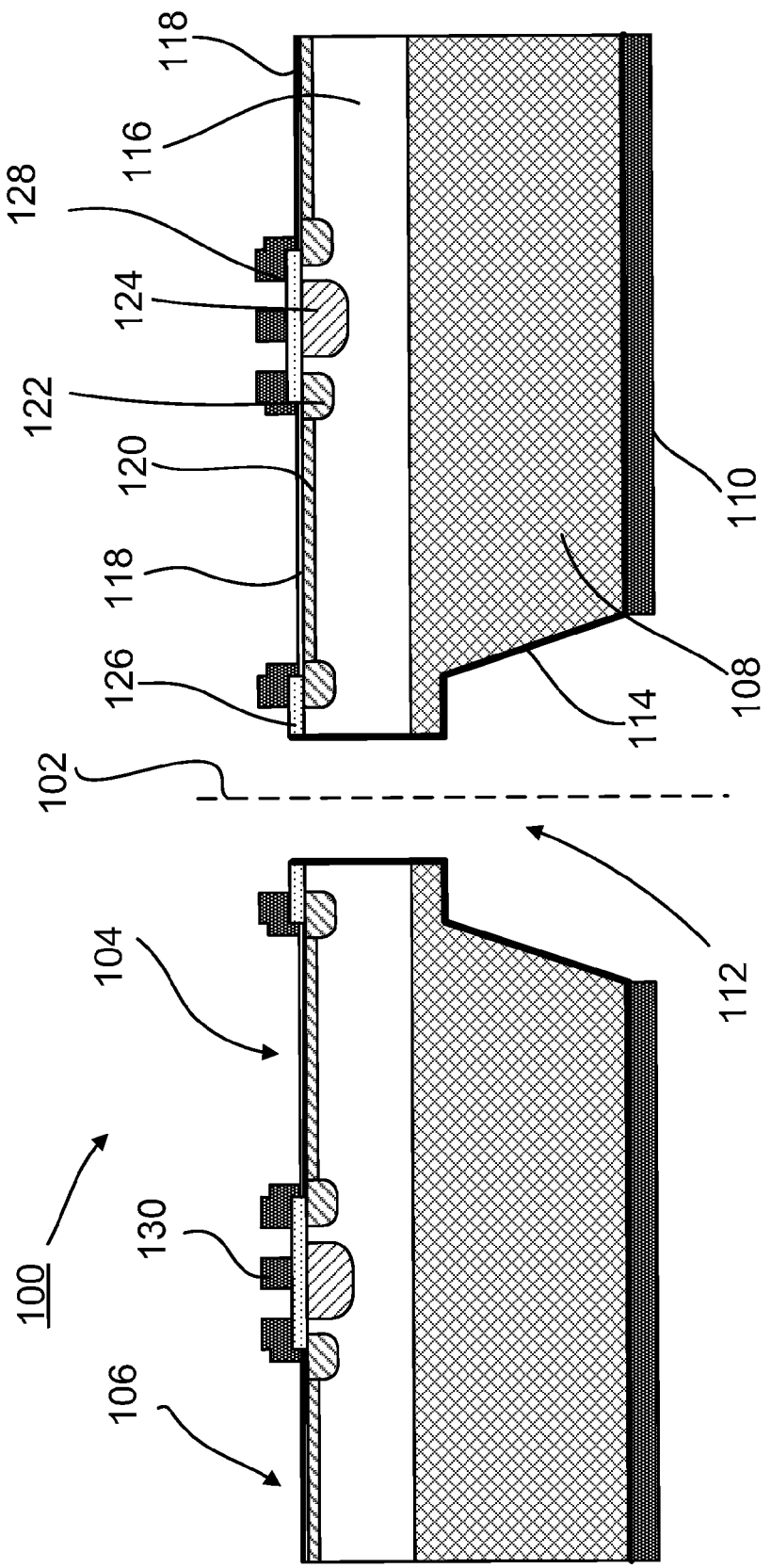
FIG. 1 schematically shows a cross-section of a sensor comprising multiple detectors according to the invention.

It shows a sensor 100 showing symmetry round axis 102. The sensor shows two detectors 104 and 106, each having an area sensitive to radiation. The detectors may be annular detectors, but each annulus may be divided further in segments, for example three 120° segments, or four 90° segments, each segment forming a separate detector.

The sensor comprises an n-type substrate 108, which at one side is metallised so as to form a back-electrode 110. On the other side of the substrate an intrinsic layer in the form of an epitaxial layer 116 is formed with a thickness of e.g. 40 μm. On top of the epitaxial layer a boron layer 118 is deposited, whereby a $p^+$-type diffusion layer of silicon-boride layer 120 is formed. Enclosing the areas sensitive to radiation p-doped (boron doped) boundaries 122 are formed. The detectors are electrically insulated from each other by a n-doped implant area 124, for example a phosphorus implanted area, between them that, together with the p-implanted areas 122 forms, a p-n-p barrier between the detectors. Part of the epitaxial layer is covered by a layer of silicon dioxide 126, upon which aluminium tracks 130 are formed for transporting the detectors' signal. The aluminium tracks connect to the conductive grid 128 formed on the boron layer or at the border of the boron layer. The sensor further shows a through-hole 112. The inside of the through-hole is covered with a metallization layer 114, electrically connected with back-electrode 110.

On the n-doped silicon substrate 108, with a typical volume resistivity of 1-10Ω·cm, an intrinsic layer in the form of an epitaxial layer 116 of silicon is grown. Inventor prefers a thick epitaxial layer of, for example, 40 μm for two reasons: the capacitance between the electrodes is then small, resulting in a relatively large signal, and the detector can be used to detect radiation with a small penetration depth, such as low-energetic electrons, as well as radiation with a large penetration depth, such as X-ray photons and, for example, fluorescent light emerging from the sample.

On top of the intrinsic layer the boron layer 118 is deposited. This is a pure, amorphous boron layer. Preferably this boron layer is a thin layer, with a thickness below 10 nm, more preferably below 5 nm, most preferably below 3 nm, so that electrons can easily travel through the boron layer and reach the depletion layer (the active volume). Due to the boron layer being formed on the epitaxial layer a silicon-boride layer 120 is formed between the boron layer and the epitaxial layer.

The substrate has a metalized back-side 110, forming an electrode. Preferably this electrode is a common electrode for all detectors on the sensor. The aluminium grid 128 is specific for each detector. Hereby the signal of each detector can be detected by measuring the current/voltage induced between the common electrode 110 and the specific electrode, such as electrode 128 specific to detector 106.

The aluminium grid is in contact with the boron layer, and is fed to collection pads via aluminium tracks 130 that are formed on an electric insulator 126. It is noted that the aluminium grid 128 may only be present on the boundary of the detectors, but may also form a grid over the boron layer, thereby drastically lowering the surface resistance of any given point to the aluminium tracks 130.

Each detector is a so-named P-I-N diode, formed by the $p^+$-diffusion layer, the intrinsic layer, and the n-doped substrate. Any holes in the intrinsic layer will thus travel to the $p^+$-layer, and any electrons in the intrinsic layer to the n-doped substrate. The electron/hole pairs generated in the intrinsic layer will induce a current between the first and the second electrode. Such electron/hole pairs are generated by impinging electrons, where the number of electron/hole pairs is proportional to the energy with which the electrons enter the intrinsic layer and inversely proportional to the energy needed to form an electron/hole pair. Therefore the intrinsic layer is also named the active layer.

To minimize the energy loss between the moment that an impinging electron enters the detector by entering the protective layer (not shown) and the moment that it enters the intrinsic layer, the boron layer and the diffusion layer should be as thin as possible. If the detector is covered by a protective layer (not shown) this layer should be thin as well, and preferably comprise low-Z materials only so as to minimize scattering.

In working a beam of electrons is directed along the axis from the back-side of the sensor through the through-hole to a sample situated at the radiation sensitive side. At the sample for example secondary electrons (SE's) and back-scattered electrons (BSE's) are liberated. SE's are often defined as electrons that, as a result of impinging electrons, emerge from the sample with an energy of less than 50 eV, while BSE's are defined as electrons emerging from the sample with an energy in excess of 50 eV. Preferably the sensor is at a slight positive potential with respect to the sample (either by biasing the sample or by biasing the sensor), so that SE's are accelerated to the sensor and thus to the detectors on the sensor. SE's are detected quite close to the axis, as they have little energy radial to the axis, while BSE's are detected by the detectors further removed from the axis, as these electrons often have a radial energy to start with.

It is noted that for performing Scanning Transmission Electron Microscopy in a SEM, there is no need for the central hole. On the contrary, this hole would only represent an area of the sensor that is 'blind' to the transmitted electrons.

When performing scanning transmission electron microscopy in a Transmission Electron Microscope (TEM) however, there is often a need to detect electrons that are deflected (scattered) over an angle larger than a predefined angle, while electrons scattered over a smaller angle pass through the through-hole to be imaged by the imaging optics of the TEM.

Figure 2:
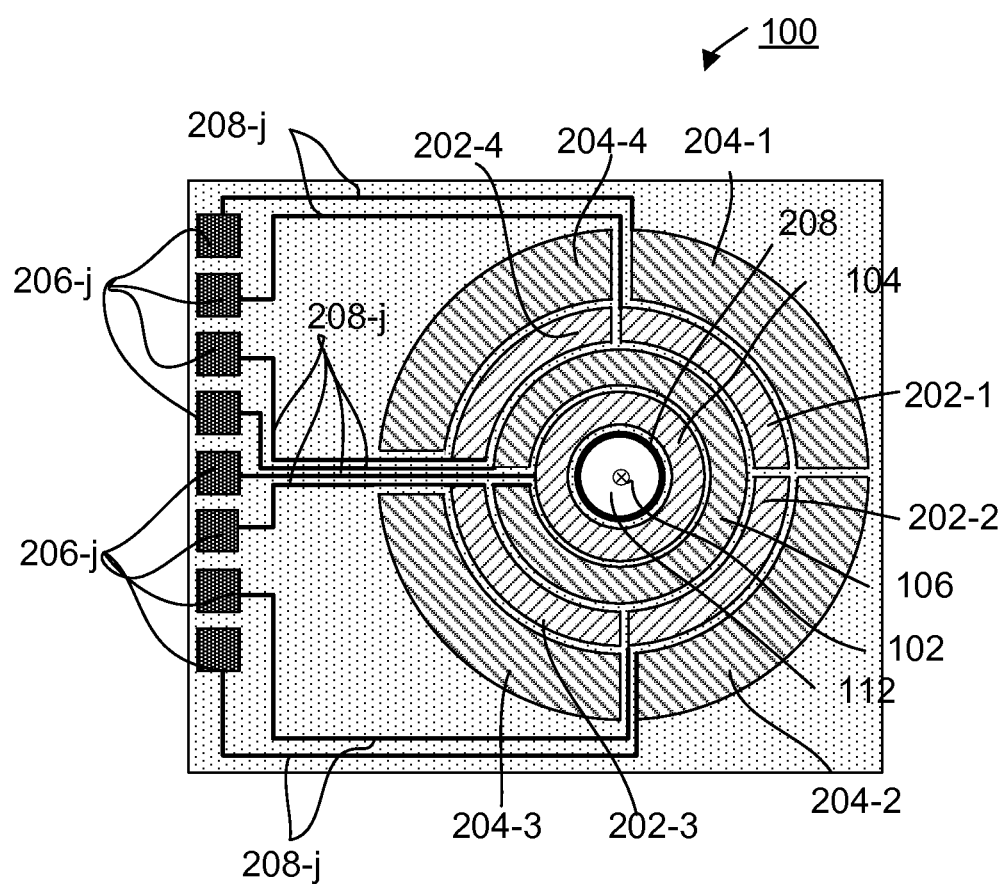
FIG. 2 schematically shows a sensor with a multitude of detectors.

FIG. 2 schematically shows a sensor with a multitude of detectors.

Sensor 100 shows a through-hole 112 round axis 102, the axis being perpendicular to the drawing. The sensor shows an annular detector 104 and an annular detector 106 surrounding detector 104. A number of detectors 202-$i$, with i=1 ... 4, arranged around the annular detector 106, together forming an annulus Likewise four detectors 204-$i$ together form an annulus round detectors 202-$i$. The sensor further shows a number of connection pads 206-$j$ (j=0 ... number of detectors on the sensor, one of the pads connected to the common electrode formed on the back-side) for detecting the signal of each detector. Each connection pad is connected with a corresponding detector by a track 208-$j$.

As mentioned before, back-scattered electrons are detected by the detectors further removed from the axis. These detectors are segmented in four 90° segments. Hereby the topographical information of the sample can be determined by comparing the signal induced in corresponding segments, as well by comparing the signal from different annuli.

It is noted that backscattered electrons also have more energy than secondary electrons, and thus generate more electron-hole pairs, provided all energy of these electrons is dissipated in the active region of the detector: any electron/hole pairs generated in the n-doped substrate will recombine and are thus not detected.

It is noted that detectors can also be combined at different distances from the (radiation sensitive) surface. This can be done by e.g. direct bonding of two sensors onto each other, or by forming the detectors according to the invention on top of a substrate that already comprises so-named buried detectors. The detectors can form a PIN-bonding-PIN or a PIN-bonding-NIP structure. The buried detector can be used to detect radiation with a different penetration depth.

It is remarked that the use of buried detectors in itself is known from, for example, U.S. Pat. No. 4,238,760, where the detectors show a different response for light with a different wavelength.

Figure 3:
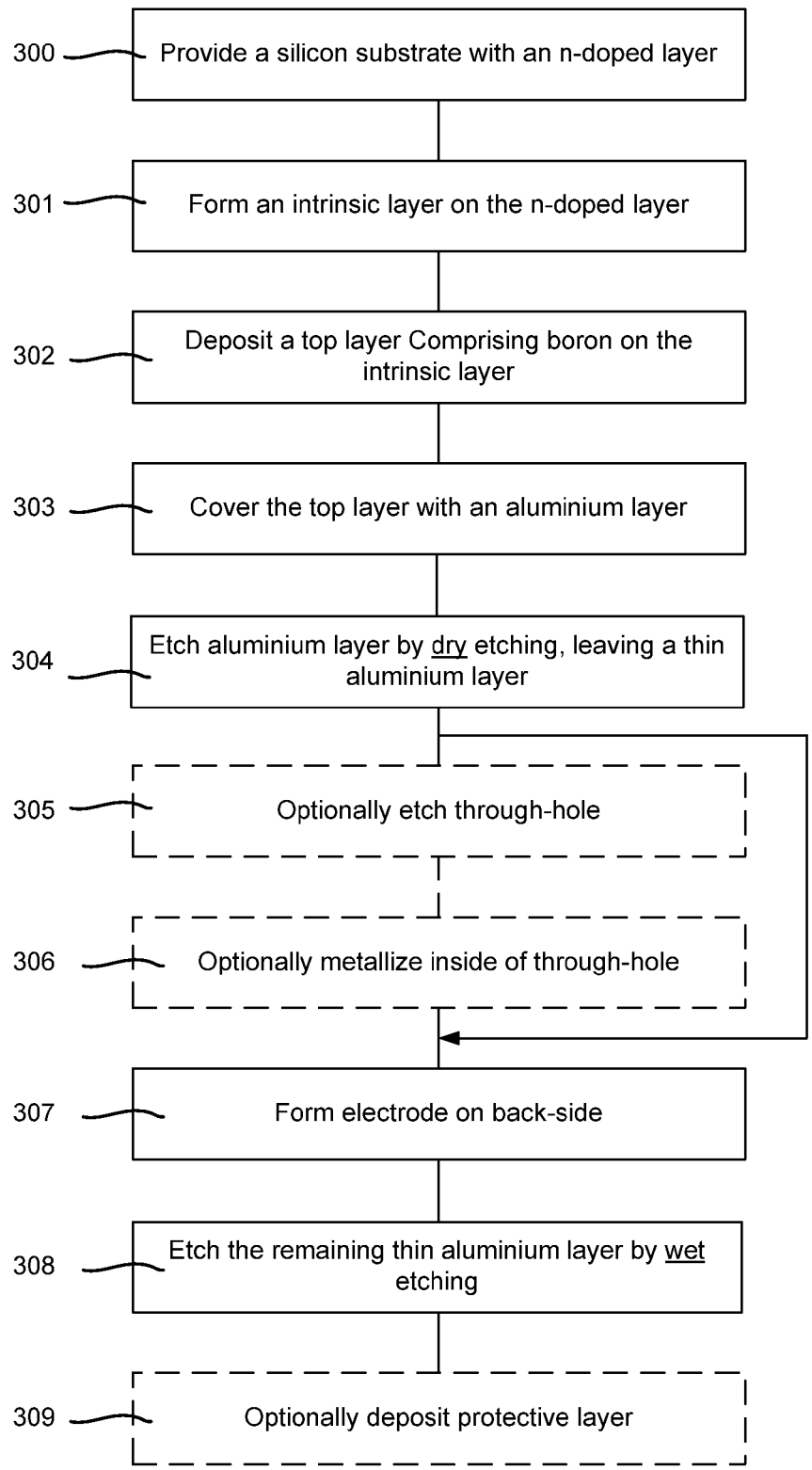
FIG. 3 schematically shows the steps for manufacturing the detector.

FIG. 3 schematically shows the steps for manufacturing the detector.

In step 300 an n-doped silicon substrate is provided. These substrates are readily available.

In step 301 an intrinsic layer is formed on the front-side of the substrate, for example by growing an epitaxial layer on the substrate. In this context 'front-side' should be interpreted as the side of the sensor that is sensitive to radiation. In a preferred embodiment of the sensor this is a thick layer of, for example, more than 10 µm thickness.

It is noted that n-doped silicon substrates with an intrinsic layer on it are readily available, but that these do not show the thickness of, for example, more than 10 µm.

It is mentioned that the detector areas should preferably be defined in a surface isolation layer.

In step 302 a top layer comprising boron with a thickness of several nanometres is formed on the intrinsic layer. The top layer may be an amorphous boron layer, but may be a conductive layer comprising boron and another low-Z element, such as carbon, nitrogen or oxygen, or a mixture thereof. While depositing the top layer, also a $p^+$-type diffusion layer of silicon-boride is formed between the intrinsic layer and the top layer.

In step 303 the top layer is completely covered with a conductive material such as aluminium. This conductive material is used to make a low-ohmic contact between the top layer and terminals, and thus extends beyond the top layer.

In step 304 a part of the aluminium layer covering the top layer is removed, leaving only a thin layer of aluminium on the top layer. Although most of the aluminium is removed after this step, the top layer is not exposed to, and thus not damaged by, the dry etching. In this way the remaining aluminium protects the detector surface during (optional) back-wafer processing In optional step 305 a through-hole is formed in the substrate for passing a beam of charged particles, so that the sensor can be used in e.g. a Scanning Electron Microscope (SEM).

In optional step 306 the inside of the through-hole is metalized to avoid charging.

In step 307 an electrode is formed on the back-side.

In step 308 the remaining aluminium layer is opened by wet etching, thereby exposing the top layer. As boron is more enduring to wet etching than e.g. aluminium, damage to the top layer—comprising boron—can be minimal.

In optional step 309 a protective layer, for example a boron nitride or boron carbide layer, is formed on the top layer. It is noted that the top layer does not change significantly by exposing it to the atmosphere.

It is noted that the protective layer can optionally also be deposited after step 302 (deposition of the top layer). It is further noted that, if the protective layer is sufficiently thin, its resistivity (between the top layer and the grid) is governed by quantum effects, and that thereby the isolating properties of bulk boron compounds are of no consequence.

By combining the dry etching of step 307 and the wet etching of step 308, the low under-etching of the dry etching is combined with the selectivity of the wet etching. The result is a process with high controllability and good pattern definition.

Figure 4:
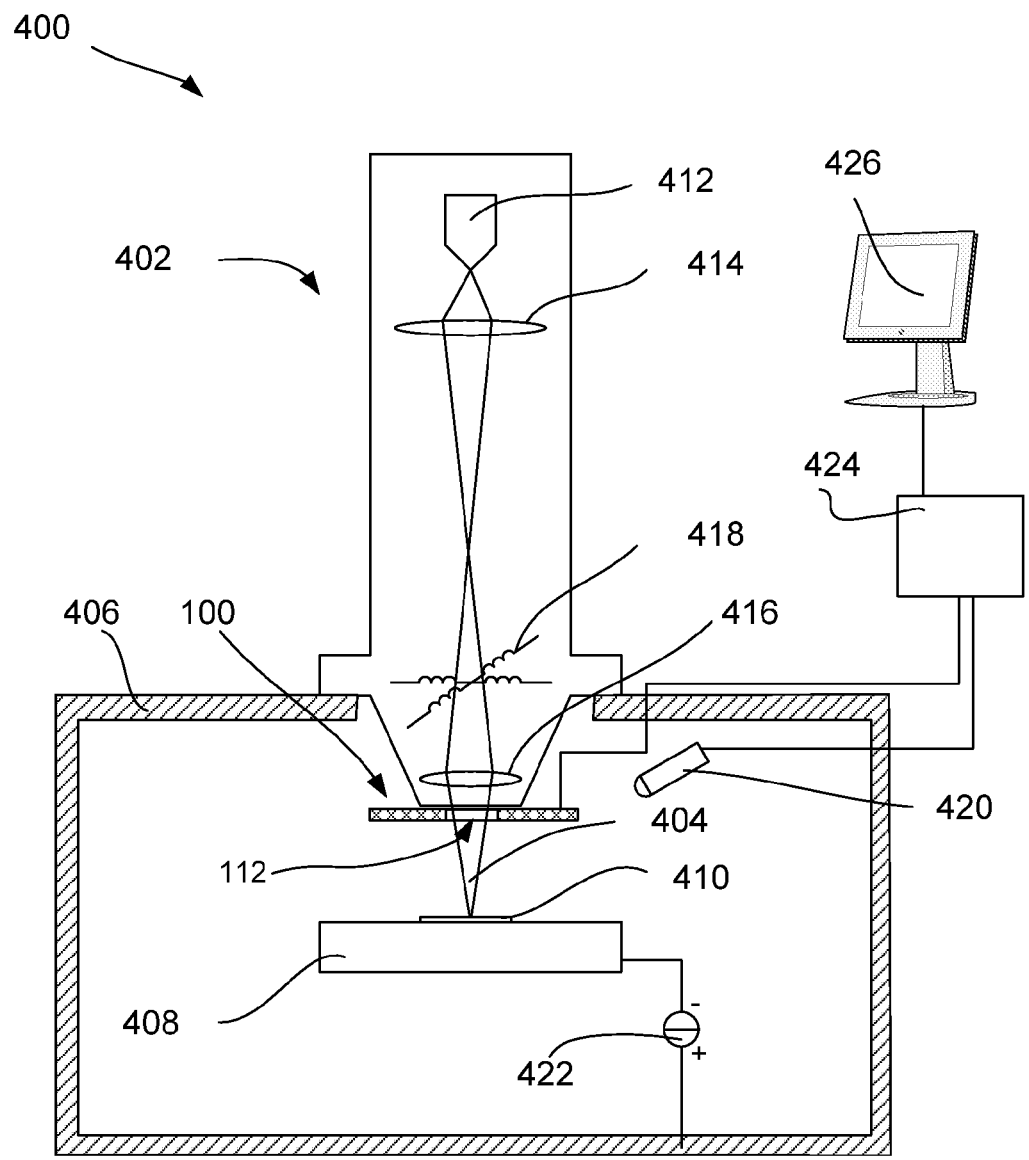
FIG. 4 schematically shows a SEM equipped with the detector.

FIG. 4 schematically shows a SEM equipped with the detector.

FIG. 4 shows a particle-optical apparatus, such as a SEM 400, equipped with a SEM column 402. The SEM column produces an electron beam 404. The SEM column is mounted on a vacuum chamber 406, the vacuum chamber comprising a sample stage 408 for holding a sample 410. As known to the skilled person the vacuum chamber is evacuated by vacuum pumps (not shown) The sample stage, or at least the sample, may be biased (floated) to a potential with respect to ground by voltage source 422. The SEM column comprises an electron source 412, lenses 414, 416 to focus the electrons on the sample, and a deflection unit 418. The apparatus is further equipped with a standard SE detector, such as an Everhart-Thornley detector 420, for detecting secondary electrons, and a sensor according to the invention 100. The sensor 100 shows a through-hole 112 for passing the beam 404. The apparatus further comprises a controller 424 for controlling, amongst others, the deflection unit 418, the lenses, and the detectors 420 and 100, and displaying information gathered from the detectors on a display unit 426.

By scanning the beam 404 over the sample 410 radiation, such as secondary electrons and back-scattered electrons, emerge from the sample. Secondary electrons drift to the Everhart-Thornley detector 404, there to be detected. Backscattered electrons are detected by sensor 100.

As this radiation is position sensitive (due to the scanning), the information obtained is position dependent as well.

The signals from the sensors/detectors, either from one of these or a combination of two or more sensors/detectors, is processed by the controller 424 and displayed. The processing may include combining, integrating, subtracting, false colouring, edge enhancing, and other processing known to the person skilled in the art. Also automated recognition processes, such as used for e.g. particle analysis, may be included in this processing.

It is noted that a combination of sensors/detectors may be detectors in e.g. sensor 100, but may also be a combination of signals from sensor 100 and detector 420.

The voltage source 422 may be used to bias the sample with respect to the column. Thereby secondary electrons are accelerated towards the sensor 100 with a sufficient energy to be detected. This makes detector 420 redundant.

It is mentioned that many refinements and alternatives are known to the skilled person, including, but not limited to, the detection of light, X-rays, the use of dual beams (for example an electron beam for imaging and an ion beam for machining the sample), the use of a controlled environment at the sample (for example a pressure of several mbar as used in an Environmental SEM, or by admitting gasses, such as etching or precursor gasses), etc.

It is noted that, although the invention is explained by means of silicon wafers, different semiconductors may be used, such as germanium, or GaAs wafers. germanium wafers have the benefit of generating a higher signal due to the lower band gap, resulting in more electron-hole pairs for an impinging electron with a given energy, while a GaAs wafer will show lower leakage ('dark current') at room temperature.

We claim as follows:

1. A method of manufacturing a radiation detector having a radiation sensitive surface, the method comprising:
   providing a planar substrate, the substrate showing an n-doped plane and an intrinsic layer formed on the n-doped plane;
   of depositing a top layer comprising boron on the intrinsic layer, thereby forming a $p^+$-type diffusion layer between the intrinsic layer and the top layer comprising boron;
   forming a first electrode comprising a grid of conductive material, at least part of the grid formed on the top layer, said grid electrically connected to the top layer while leaving part of the top layer exposed, wherein the grid of conductive material of the first electrode is formed by covering the top layer completely with a layer of conductive material and then removing part of the layer of conductive material by etching, the etching comprising a first step of dry etching, the step of dry etching defining the grid but leaving a thin layer of conductive material on the part of the top layer to be exposed, followed by a second step of wet etching, the step of wet etching completely removing the conductive layer from the part of the top layer to be exposed; and
   forming a second electrode connected with the n-doped plane.

2. The method of claim 1 further comprising forming a protective layer of boron nitride, boron carbide, boron oxide, or a mixture thereof, on at least the exposed part of the top layer, the protective layer having a thickness of less than ten nanometers.

3. The method of claim 1 in which, before the step of wet etching the exposed part of the top layer, a through-hole is formed in the substrate, and before or after wet etching the exposed part of the top layer the inside of the through-hole is covered with a conductive layer.

4. The method of claim 1 in which the conductive material of the grid comprises a material selected from the group comprising: Al, Ti, TiN, Co, Mo, Pd, Pt, W, Au, Ni, Cr, Cu and C.

5. The method of claim 1 in which the intrinsic layer has a thickness in excess of 1 μm, as a result of which the capacitance of the detector showing a surface area of N $mm^2$ is less than 100×N pF.

6. The method of claim 1 in which the intrinsic layer is an epitaxial layer.

7. The method of claim 1 in which during and after forming the boron layer the temperature is kept below 750° C.

8. The method of claim 1 in which a multitude of detectors is formed on the substrate, the detectors placed side-by-side or placed on top of each other.

9. The method according to claim 1 in which the step of depositing a layer comprising boron is a step of depositing boron with a purity of better than 70%.

10. The method of claim 9 in which the deposition of the layer comprising boron includes the deposition of carbon, nitrogen or oxygen, or a mixture thereof.

11. The method of claim 1 in which the layer of conductive material is a homogeneous layer of conductive material.

12. The method of claim 1 further comprising forming a protective layer of boron nitride, boron carbide, boron oxide, or a mixture thereof, on at least the exposed part of the top layer, the protective layer having a thickness of less than five nanometers.

13. The method of claim 1 further comprising forming a protective layer of boron nitride, boron carbide, boron oxide, or a mixture thereof, on at least the exposed part of the top layer, the protective layer having a thickness of less than three nanometers.

14. The method of claim 1 in which the intrinsic layer has a thickness in excess of 10 μm, as a result of which the capacitance of the detector showing a surface area of N $mm^2$ is less than 10×N pF.

15. The method of claim 1 in which the intrinsic layer has a thickness in excess of 40 μm, as a result of which the capacitance of the detector showing a surface area of N $mm^2$ is less than 2.5×N pF.

16. The method of claim 1 in which during and after forming the boron layer the temperature is kept below 700° C.

17. The method of claim 1 in which during and after forming the boron layer the temperature is kept below 600° C.

18. The method according to claim 1 in which the step of depositing a layer comprising boron is a step of depositing boron with a purity of better than 90%.

19. The method according to claim 1 in which the step of depositing a layer comprising boron is a step of depositing boron with a purity of better than 99%.

* * * * *